US008847139B2

(12) United States Patent
Dyer

(10) Patent No.: US 8,847,139 B2
(45) **Date of Patent: *Sep. 30, 2014**

(54) METHODS, SUB-SYSTEMS AND SYSTEMS THAT REDUCE A MISMATCH ERROR ASSOCIATED WITH AN ANALOG CIRCUIT

(75) Inventor: Kenneth C. Dyer, Pleasanton, CA (US)

(73) Assignee: Intersil Americas LLC, Milpitas, CA (US)

( * ) Notice: Subject to any disclaimer, the term of this patent is extended or adjusted under 35 U.S.C. 154(b) by 662 days.

This patent is subject to a terminal disclaimer.

(21) Appl. No.: 13/211,237

(22) Filed: Aug. 16, 2011

(65) Prior Publication Data

US 2012/0049927 A1 Mar. 1, 2012

Related U.S. Application Data

(63) Continuation-in-part of application No. 12/987,394, filed on Jan. 10, 2011, now Pat. No. 8,242,430.

(60) Provisional application No. 61/376,638, filed on Aug. 24, 2010.

(51) Int. Cl.

| | |
|---|---|
| ***H01J 40/14*** | (2006.01) |
| ***G01J 1/44*** | (2006.01) |
| ***H03K 17/78*** | (2006.01) |
| ***G05F 3/26*** | (2006.01) |
| *G09G 3/34* | (2006.01) |

(52) U.S. Cl.

CPC .......... *G05F 3/262* (2013.01); *G09G 2330/021* (2013.01); *G09G 3/3406* (2013.01); *G09G 2360/144* (2013.01); *G09G 2320/0626* (2013.01)

USPC .............. 250/214 R; 250/214 C; 250/214 DC

(58) Field of Classification Search

CPC ............. G01J 1/44; G01J 1/42; G01J 1/4204; G01J 1/1626; G01J 1/4228; H03K 5/02; H03K 5/023; H03K 5/24; H03K 5/2481; H03K 5/2418; H03F 3/45493; H03F 3/45488; H03F 3/45582; H03F 3/456; H03F 3/45618; H03F 3/343; H03F 3/347; G09G 2360/144; G09G 2320/0626; G09G 2330/021; G09G 3/3406; G05F 3/262

USPC ........ 250/214 AL, 214.1, 214 R, 205, 214 A, 250/214 B, 338.1, 339.02, 214 C, 214 DC, 250/221; 340/540, 555, 600, 870.21, 146.2; 345/207; 356/350; 348/602, 603; 330/257, 258; 327/53, 66, 490, 514; 341/135, 133

See application file for complete search history.

(56) References Cited

U.S. PATENT DOCUMENTS 4,064,506 A * 12/1977 Cartwright, Jr. .............. 341/135
4,573,005 A * 2/1986 van de Plassche ............ 323/315

(Continued)

FOREIGN PATENT DOCUMENTS

JP 2008-099039 4/2008

OTHER PUBLICATIONS

Office Action dated Feb. 29, 2012, in U.S. Appl. No. 12/987,394.

(Continued)

*Primary Examiner* — Que T Le
*Assistant Examiner* — Jennifer Bennett
(74) *Attorney, Agent, or Firm* — Vierra Magen Marcus LLP

(57) ABSTRACT

Circuits, methods, sub-systems and systems including adaptive analog subtraction for light sensing are described herein. In an embodiment, an analog circuit including a current mirror is configured to replicate a first current to produce a replicated version of the first current, and to subtract the replicated version of the first current from a second current to produce a third current. A mismatch correction circuit is configured to produce an adjustment signal, indicative of a mismatch error associated with the analog circuit, based on a digital version of the third current. This adjustment signal is used to reduce the mismatch error associated with the analog circuit.

20 Claims, 14 Drawing Sheets

I1 = Iir, which is indicative of ambient infrared light
I2 = Ivis + Iir, which is indicative of ambient visible light + ambient infrared light
I3 = I2 - I1*(1 +/- Delta) = (Ivis + Ir) - Iir*(1 +/- Delta) = Ivis + Ir - Ir +/- Ir*Delta = Ivis +/- Ir*Delta

(56) References Cited

U.S. PATENT DOCUMENTS

| | | | | |
|---|---|---|---|---|
| 4,606,637 | A | 8/1986 | Geen | |
| 4,920,257 | A | 4/1990 | Fuerthbauer | |
| 5,534,827 | A | 7/1996 | Yamaji | |
| 6,141,169 | A | 10/2000 | Pietruszynski et al. | |
| 6,842,486 | B2 | 1/2005 | Plisch et al. | |
| 7,132,860 | B2 | 11/2006 | Lehto | |
| 7,161,413 | B2 | 1/2007 | Botker et al. | |
| 7,482,859 | B2 * | 1/2009 | Wang et al. | 327/538 |
| 7,538,705 | B2 | 5/2009 | Deval et al. | |
| 7,917,196 | B2 | 3/2011 | Zhang et al. | |
| 7,928,774 | B2 * | 4/2011 | Zannoth et al. | 327/108 |
| 8,242,430 | B2 * | 8/2012 | Dyer | 250/214 R |
| 2008/0006762 | A1 | 1/2008 | Fadell et al. | |
| 2008/0217516 | A1 | 9/2008 | Suzuki et al. | |
| 2008/0237669 | A1 | 10/2008 | Yanagisawa et al. | |

OTHER PUBLICATIONS

Notice of Allowance dated Jun. 12, 2012, in U.S. Appl. No. 12/987,394.

Le et al., "An Analog DFE for Disk Drives Using a Mixed-Signal Integrator," Solid-State Circuits Research Lab, Dept. of Electrical and Computer Engineering, University of California, Davis, CA, pp. 1-23 (May 1999).

Widrow et al., "Adaptive Signal Processing, Chapter 12: Adaptive Interference Canceling," Prentice Hall, pp. 302-307 (May 25, 1985).

Amendment filed Mar. 5, 2014, in Chinese Patent Application No. 100129715 filed Aug. 19, 2011.

Hansen et al. "Pulse-based Interface Circuits for SPR Sensing Systems," IEEE, International Symposium on Circuits and Systems Kobe, Japan, May 2005.

European Search Report for European Application No. 11178156, dated Jan. 19, 2012.

* cited by examiner

I1 = Iir, which is indicative of ambient infrared light
I2 = Ivis + Iir, which is indicative of ambient visible light + ambient infrared light
I3 = I2 - I1*(1 +/- Delta) = (Ivis + Ir) - Iir*(1 +/- Delta) = Ivis + Ir - Ir +/- Ir*Delta = Ivis +/- Ir*Delta I1 = Iir, which is indicative of ambient infrared light
I2 = Ivis + Iir, which is indicative of ambient visible light + ambient infrared light
I3 = I2 - I1*(1 +/- Delta) = (Ivis + Ir) - Iir*(1 +/- Delta) = Ivis + Ir - Ir +/- Ir*Delta = Ivis +/- Ir*Delta

METHODS, SUB-SYSTEMS AND SYSTEMS THAT REDUCE A MISMATCH ERROR ASSOCIATED WITH AN ANALOG CIRCUIT

PRIORITY CLAIM

This application is a continuation-in-part (CIP) of U.S. patent application Ser. No. 12/987,394, entitled APPARATUSES AND METHODS THAT REDUCE MISMATCH ERRORS ASSOCIATED WITH ANALOG SUBTRATIONS USED FOR LIGHT SENSING, filed Jan. 10, 2011, which issued as U.S. Pat. No. 8,242,430, and claims priority under 35 U.S.C. 119(e) to U.S. Provisional Patent Application No. 61/376,638, entitled ADAPTIVE ANALOG INFRARED SUBTRACTION CIRCUIT FOR AN AMBIENT LIGHT SENSOR, filed Aug. 24, 2010. Priority is claimed to each of the above applications. Each of the above applications is incorporated herein by reference.

BACKGROUND

Photodetectors can be used as ambient light sensors (ALSs), e.g., for use as energy saving light sensors for displays, for controlling backlighting in portable devices such as mobile phones and laptop computers, and for various other types of light level measurement and management. For more specific examples, ambient light sensors can be used to reduce overall display-system power consumption and to increase Liquid Crystal Display (LCD) lifespan by detecting bright and dim ambient light conditions as a means of controlling display and/or keypad backlighting. Without ambient light sensors, LCD display backlighting control is typically done manually whereby users will increase the intensity of the LCD as the ambient environment becomes brighter. With the use of ambient light sensors, users can adjust the LCD brightness to their preference, and as the ambient environment changes, the display brightness adjusts to make the display appear uniform at the same perceived level; this results in battery life being extended, user eye strain being reduced, and LCD lifespan being extended. Similarly, without ambient light sensors, control of the keypad backlight is very much dependent on the user and software. For example, keypad backlight can be turned on for 10 second by a trigger which can be triggered by pressing the keypad, or a timer. With the use of ambient light sensors, keypad backlighting can be turned on only when the ambient environment is dim, which will result in longer battery life. In order to achieve better ambient light sensing, ambient light sensors preferably have a spectral response close to the human eye response and have excellent infrared noise suppression.

DETAILED DESCRIPTION

Figure 1A:
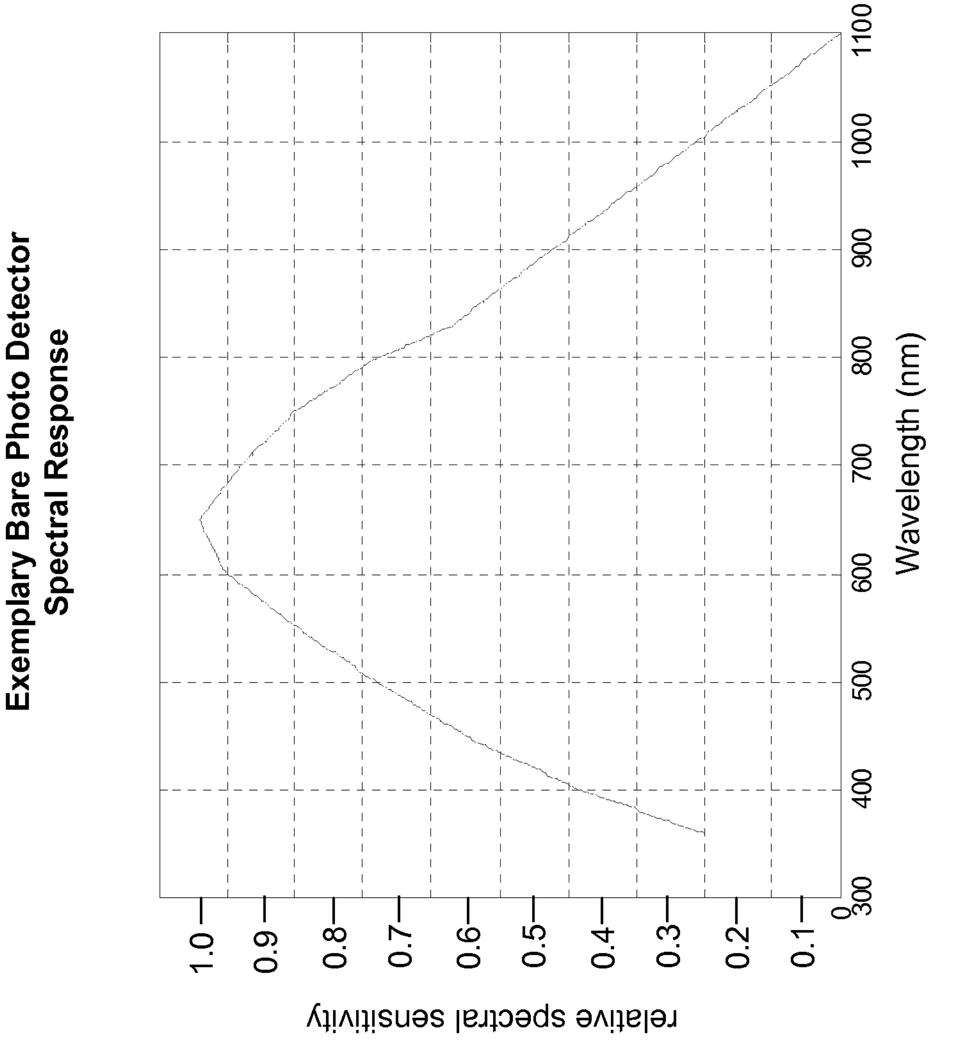
FIG. 1A illustrates an exemplary spectral response of a photodetector without any spectral response shaping.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Figure 1B:
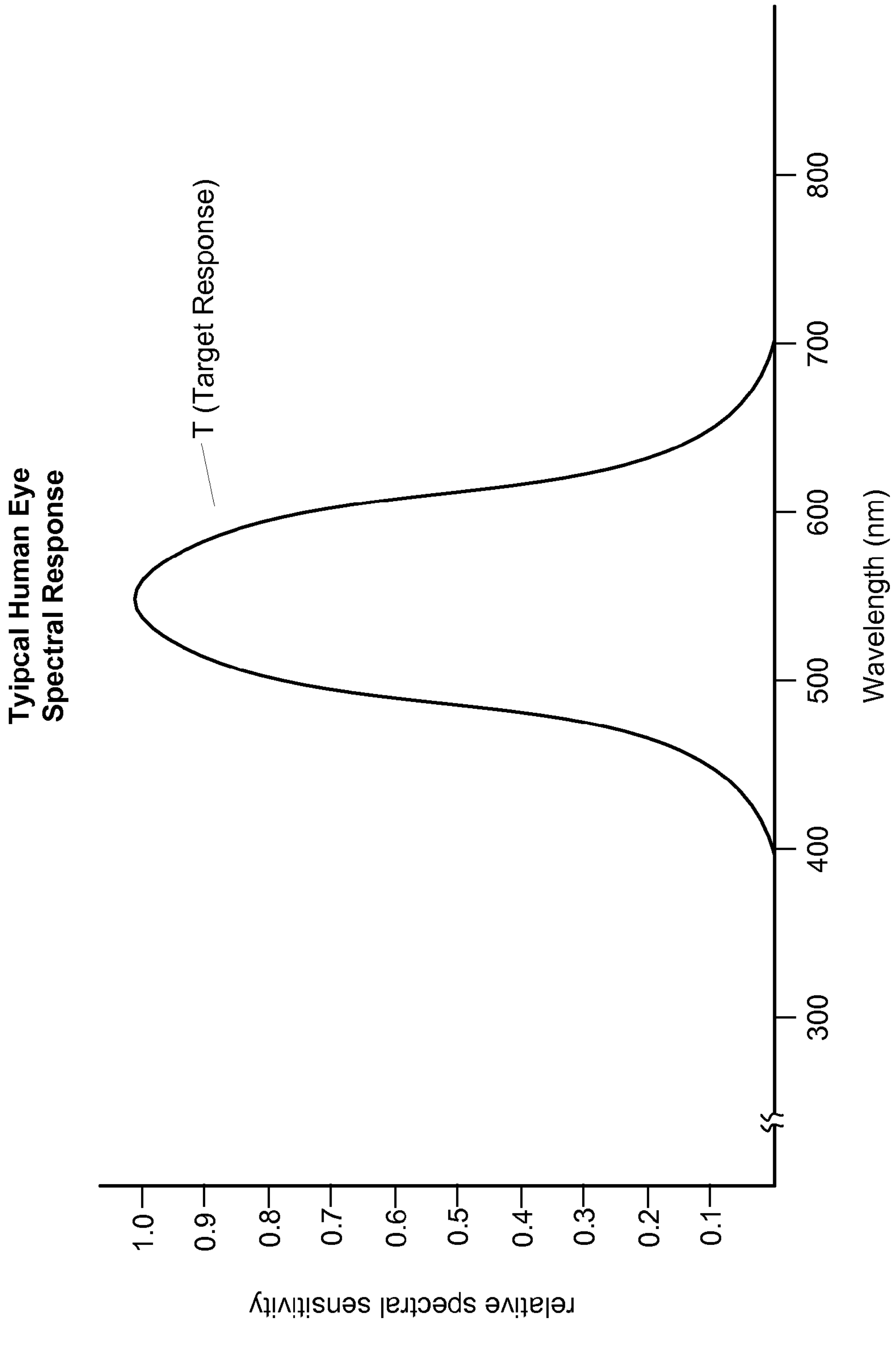
FIG. 1B illustrates the typical spectral response of a human eye.

FIG. 1A shows an exemplary spectral response of a bare photodetector (i.e., without any spectral response shaping), which has a range of about 300 nm to about 1100 nm, with a peak response at about 650 nm. FIG. 1B illustrates the typical spectral response of a human eye, which has a range of about 400 nm to 700 nm, with a peak response at about 550 nm. As can be appreciated from FIGS. 1A and 1B, a problem with using the exemplary photodetector (PD) as an ambient light sensor (ALS) is that the exemplary PD detects both visible light and non-visible light, such as infrared light, which starts at about 700 nm. By contrast, notice from FIG. 1B that the human eye does not detect light above about 700 nm, and thus, does not detect infrared light. Thus, the response of a PD can significantly differ from the response of a human eye, especially when the light is produced by an incandescent light, which produces large amounts of infrared light. This would provide for significantly less than optimal adjustments if the PD were used as an ALS, e.g., for adjusting backlighting, or the like.

Another problem with using a PD as an ALS, is that a PD will produce a relatively small electric current even when no light is incident upon the PD. This current, often referred to as a dark current or a leakage current, occurs due to the random thermal generation of electrons and holes within depletion regions of a device that are then swept by a high electric field. This leakage or dark current also adversely affects the PD output when there are very low levels of light.

Figure 2:
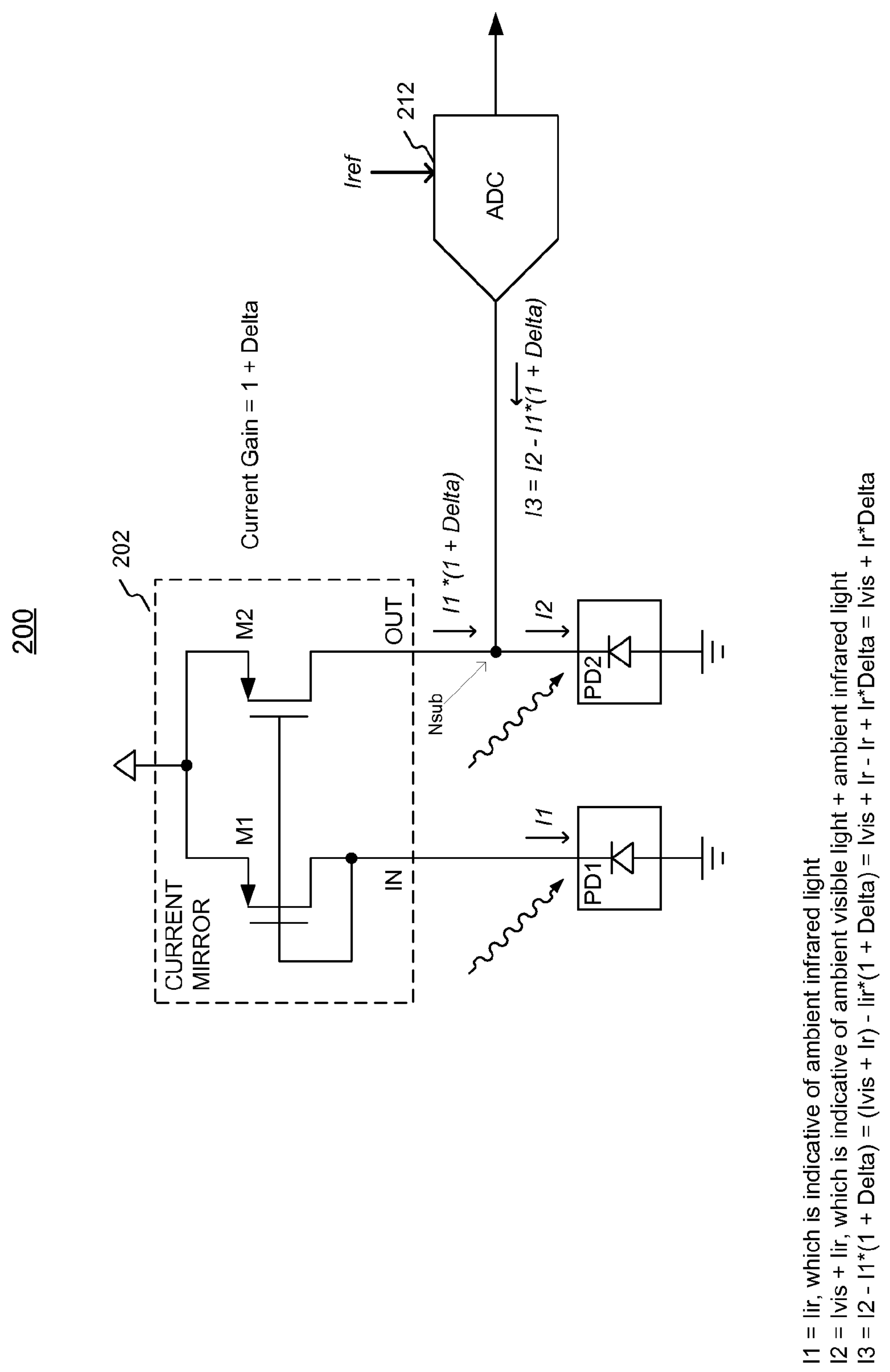
FIG. 2 illustrates a circuit in which a current mirror is used to replicate a first current produced by one or more photodetectors and to subtract the replicated current from a second current produced by one or more further photodetectors to produce a third current that may be used as a signal indicative of ambient light.

FIG. 2 illustrates an exemplary circuit 200 that can be used to attempt to produce a current having a spectral response that is similar to the spectral response of a typical human eye, which was shown in FIG. 1B. Referring to FIG. 2, a first photodetector (PD1) and a second photodetector (PD2) are shown as receiving diffused ambient light, which is presumed to be ambient light that includes both ambient visible light and ambient infrared light. PD1 is configured (e.g., by covering it with a red filter) to produce a first current I1 indicative of ambient infrared light. Accordingly, I1 can also be expressed as Iir, where Iir is a current indicative of ambient infrared light. PD2 is configured (e.g., by covering it with a green filter) to produce a second current I2 indicative of both ambient visible light and ambient infrared light. Accordingly, I2 can also be expressed as Ivis+Iir, where Ivis is a current indicative of ambient visible light, and Iir is the current indicative of ambient infrared light. In the figures, each photodetector PD1 and PD2 is generally shown and described as being a single PD. However, each PD can actually be implemented as an array of PDs. In other words, PD1 can include one or more photodetectors, and PD2 can include one or more further photo detectors.

A current mirror 202 replicates the current I1 so that a replicated version of I1 can be subtracted from the current I2 at a subtraction node (Nsub) to produce a current I3 that is primarily indicative of the ambient visible light. Preferably, the gain of the current mirror 202 is unity (i.e., equal to 1), so that the current mirror 202 exactly replicates the current I1. However, due to mismatch of transistors within the current mirror (e.g., a mismatch of transistors M1 and M2 due to manufacturing variations), the gain of the current mirror 202 is 1+Δ, causing the replicated current produced by the current mirror 202 to be I1*(1+Δ), where Δ (also referred to as "Delta") is a mismatch error of the current mirror 202. In other words, I3=I2−I1*(1+Δ)=(Ivis+Iir)−Iir*(1+Δ)=Ivis+Iir−Iir+Iir*Δ=Ivis+Iir*Δ. Since the desire is to have I3=Ivis, the desire is to make Δ=0.

The analog current I3, or a digital version thereof produced by an analog-to-digital converter (ADC) 212, can be used to adjust a parameter or function of a system or sub-system. For example, the analog current I3, or a digital version thereof, can be used to adjust the brightness of a display. However, as can be appreciated from the above discussion, the mismatch error Δ adversely affects that accuracy of the current I3, and thus, adversely affects the efficacy or usefulness of such adjustments.

Figure 3B:
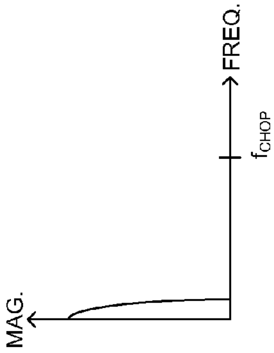
FIG. 3B is an exemplary graph illustrating the frequency content of the first current I1 produced by one or more photodetectors (PD1) before it is replicated by the current mirror of FIG. 3A.
Figure 3C:
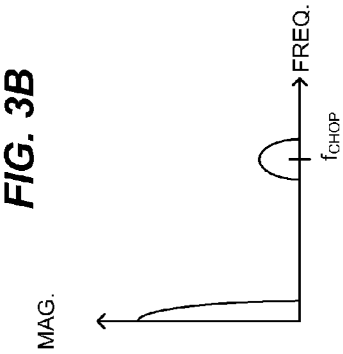
FIG. 3C is an exemplary graph illustrating the frequency content of the first current produced by the one or more further photodetectors after it is replicated by the current mirror including the chopper circuit of FIG. 3A.

One way to attempt to remove the mismatch error Δ is to use a current mirror that includes a chopping circuit, as will now be described with reference to FIG. 3A. Referring to the circuit 300 in FIG. 3A, a current mirror 302 is shown as including a chopping circuit 304. The chopping circuit 304, which receives a chopping (CHOP) signal having a chopping frequency ($f_{CHOP}$), modulates the current mismatch Δ to the chopping frequency, and causes the gain of the current mirror to be 1+/−Δ, as can be appreciated from FIGS. 3B and 3C. More specifically, FIG. 3B is illustrative of the frequency content of the current I1, and FIG. 3C is illustrative of the frequency content of the replicated current I1*(1+/−Δ) that is produced by the current mirror 302. The frequency content of the current I3, which is discussed below with reference to FIG. 5A and 5B, would also resemble FIG. 3C.

Figure 3A:
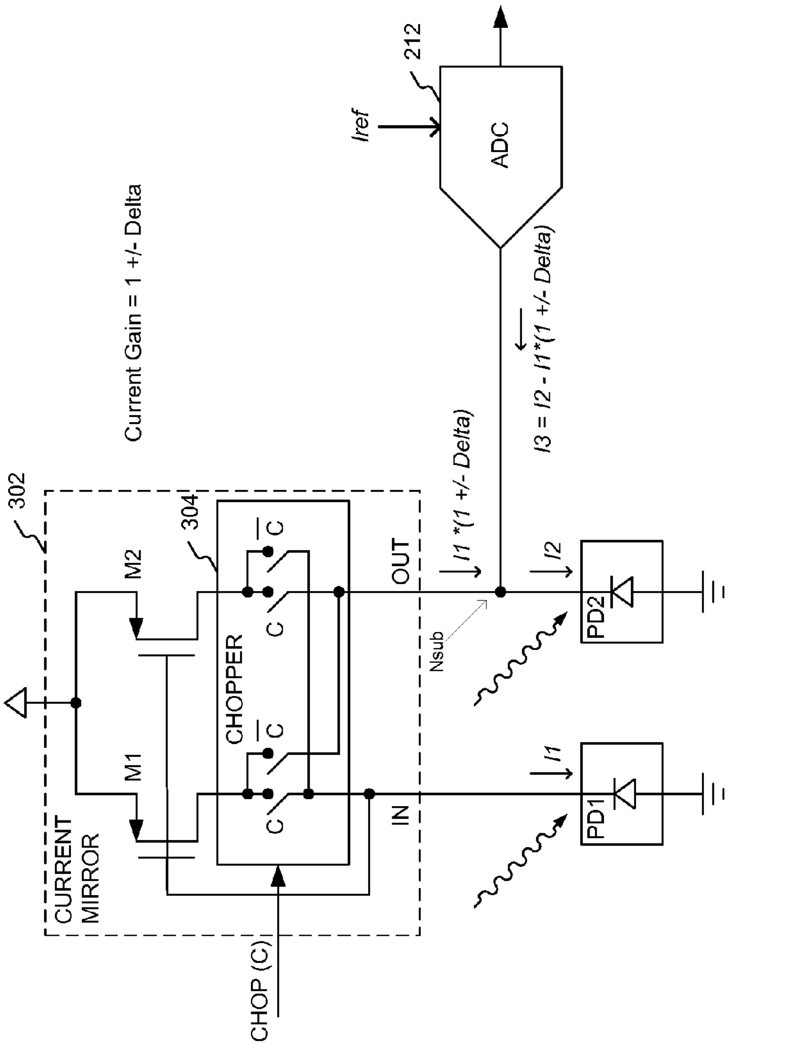
FIG. 3A illustrates an analog circuit in which a current mirror (including a chopper circuit) is used to replicate a first current produced by one or more photodetectors and to subtract the replicated current from a second current produced by one or more further photodetectors to produce a third current that may be used as a signal indicative of ambient light.
Figure 3D:
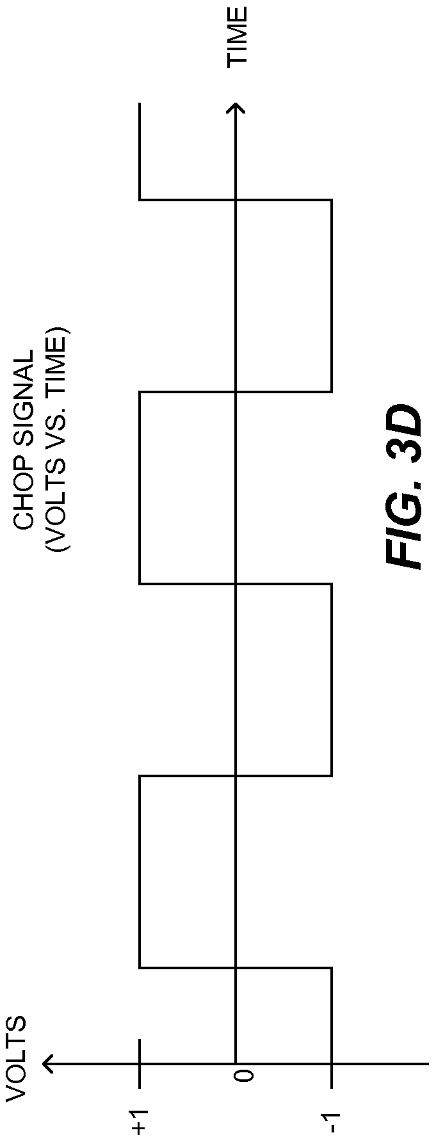
FIG. 3D illustrates an exemplary chopper signal that can be used to drive the chopper circuit of FIG. 3A.

An exemplary timing diagram for the CHOP signal is shown in FIG. 3D, which shows the CHOP signal as a square wave that alternates between a value of +1 and −1. While other chopper signals can be used, as discussed below, unless stated otherwise it will be assumed, for simplicity, that the CHOP signal shown in FIG. 3D is used.

The current mirror 302 replicates the current I1 so that a replicated version of I1 can be subtracted from the current I2 at the subtraction node (N1) to produce a current I3 that is primarily indicative of the ambient visible light. As mentioned above, because of the chopper circuit 304, the replicated current produced by the current mirror 302 is I1*(1+/−Δ), where Δ (also referred to as "Delta") is the mismatch error of the current mirror 302. Another way of expressing the replicated current produced by the current mirror 302 is I1+I1*Δ*(−1)^N, where N=0,1,2,3 . . . ∞. This replicated current is subtracted from the current I2 at the subtraction node (Nsub), to produce the current I3=I2−I1*(1+/−Δ)=Ivis+Iir−Iir+/−Iir*Δ=Ivis+/−Iir*Δ. Another way of expressing the current I3 is I3=I2−I1*(1+Δ*(−1)^N), where N=0,1,2,3 . . . ∞. Since I2=Ivis+Iir, and I1=Iir, then I3 can be expressed as I3=(Ivis+Iir)−Iir*(1+Δ*(−1)^N)=Ivis+Iir*Δ*(−1)^N, where N=0,1,2,3 . . . ∞. Assuming a two phase CHOP signal that alternates between +1 and −1, in these equations N increments twice during each period of the CHOP signal, and more specifically, N increments once for each phase of a two phase CHOP signal.

Referring again to FIG. 3A, the current I3 is shown as being provided to the ADC 212, which is employed to convert the analog current signal I3 to a digital signal. However, due to the non-ideal mismatch error Δ of the current mirror 302, the dynamic range of the ADC 212 is reduced, thereby reducing the sensitivity of an optical sub-system that includes the circuit 300.

Figure 3E:
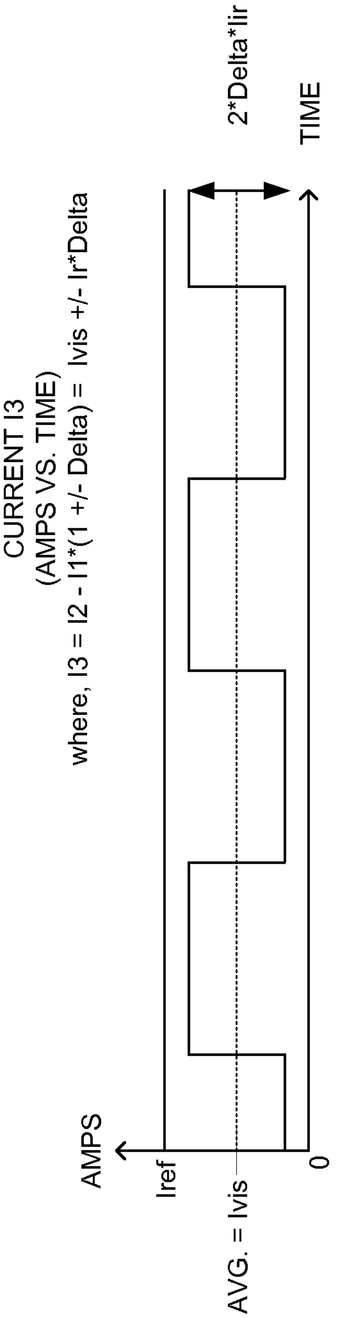
FIG. 3E illustrates an example of the third signal I3 in FIG. 3A that is produced by subtracting the replicated version of the first current I1, as produced by the current mirror of FIG. 3A, from the second I2 produced by one or more photodetectors (PD2).

FIG. 3E is an example timing diagram the third signal I3 in FIG. 3A that is produced by subtracting the replicated version of the first current, as produced by the current mirror of FIG. 3A, from the second current I2 produced by one or more photodetectors (PD2). In other words, FIG. 3 shows an example of the current Ivis +/−Iir*Δ, which can also be expressed as Ivis+Iir*Δ*(−1)^N. The timing diagram of FIG. 3E illustrates how the mismatch error Δ of the current mirror 302 limits the dynamic range of the ADC 212, with the dynamic range being dependent on the reference current (Iref) provided to the ADC 212. The average (AVG) of the signal shown in FIG. 3E is equal to the current Ivis, which is the current of interest indicative of ambient visible light. The peak-to-peak amplitude of the signal shown in FIG. 3E is 2*Δ*Iir. As can be appreciated from FIG. 3E, by making Δ=0, the signal shown in FIG. 3E would be equal to the current Ivis, and the dynamic range of the ADC 212 would be maximized.

As will now be described initially with reference to FIG. 4, embodiments of the present invention use a mismatch correction circuit to compensate for the mismatch error Δ of a current mirror. More specifically, embodiments of the present invention can be used to reduce, and preferably substantially eliminate, the mismatch error Δ of a current mirror.

Figure 4:
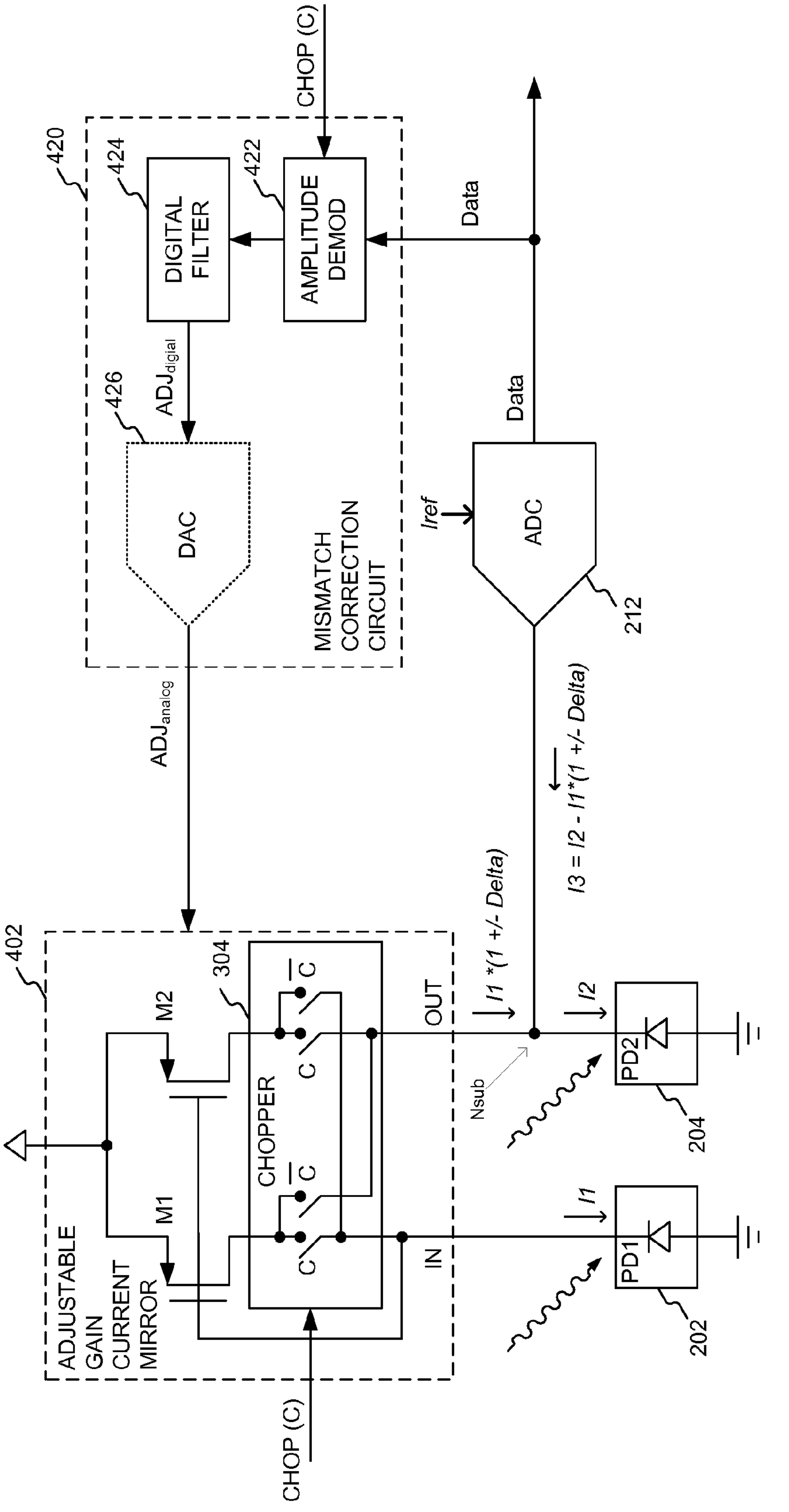
FIG. 4 illustrates a circuit, e.g., a sensor sub-system, of an embodiment of the present invention, which can be used to reduce a mismatch error of the analog circuit introduced in FIG. 3A.

Referring to FIG. 4, a sub-system 400 includes a mismatch correction circuit 420 that is used to adjust the gain of an adjustable gain current mirror 402 to thereby reduce, and preferably substantially eliminate, the mismatch error Δ of the current mirror 402. The mismatch correction circuit 420 is shown as including an amplitude demodulator 422 and a digital filter 424. The digital output of the ADC 212, also referred to as a Data signal, is provided to the amplitude demodulator 422. The amplitude demodulator, which also receives the CHOP signal (or a reproduced or recovered version of the CHOP signal), can be implemented as a simple multiplier, or as an envelope detector, but is not limited thereto. The amplitude demodulator 422 essentially performs amplitude demodulation to shift the tone at the chop frequency down to DC with a value proportional to the mismatch error Δ. In this embodiment, the CHOP signal is available, and thus, it is available for use by the demodulator 422. Alternatively, the CHOP signal can be reproduced or recovered from the third current I3 using a phased locked loop (PLL), a Costas loop, or some other carrier signal recovery circuit, but is not limited thereto.

The Data signal output by the ADC 212, which is a digitized version of the third current I3, includes a digital sample value (for each sample period of the ADC 212) that is indicative of the ambient visible light. However, these digital sample values vary up and down at the chopping frequency due to the mismatch error Δ. This occurs, because as explained above, I3=Ivis+/−Iir*Δ. The amplitude demodulator 422 receives the digital sample values output by the ADC 212, receives the CHOP signal (or a reproduced or recovered version of the CHOP signal), and outputs demodulated digital sample values that vary up and down about the baseband due to the mismatch error Δ, with an average of the demodulated digital samples values indicative of the magnitude of the mismatch error Δ. Stated another way, the output of the demodulator 422 is a digital signal including digital sample values that are proportional to the current Ivis(@$f_{CHOP}$)+Iir*Δ. These digital sample values are provided to the digital filter 424, which can be implemented as a digital low pass filter (LPF) or a digital integrator, but is not limited thereto. The digital filter 424 filters out the current Ivis(@$f_{CHOP}$). Such digital filters can be implemented, for example, using an up-down counter or a digital adder, but are not limited thereto. The signal output by the digital filter 424 is proportional to the magnitude of the mismatch error Δ, and in accordance with embodiments of the present invention, is used to adjust a gain of the current mirror 402 such that the mismatch error Δ is reduced and preferably substantially eliminated. Accordingly, the output of the digital filter 424 can be referred to as an adjustment (ADJ) signal.

The CHOP signal used in FIG. 4 may be the same as the CHOP signal described with reference to FIG. 3D. However, because the chopping frequency ($f_{CHOP}$) of the CHOP signal shown FIG. 3D is constant, the calibrating out of the mismatch error Δ, using embodiments of the present invention, may be adversely affected if a noise source in the vicinity of the circuit has a similar frequency. To overcome this potential problem, a pseudo random chopping frequency can be used, so long as an average of the CHOP signal over a period of time is substantially constant (e.g., substantially zero). To avoid aliasing, during the calibration performed by the mismatch correction circuit 420, $f_{CHOP}$ is preferably less than the sample rate frequency $f_s$ of the ADC 212. For example, $f_{CHOP}$ can equal $f_s/2$, but is not limited thereto.

Advantageously, the mismatch correction circuit 420 can performs is functionality even if the ADC 212 is overloaded. For example, the ADC 212 can be overloaded if the current Iir (indicative of infrared light) is higher than the ADC full-scale. More specifically, the ADC 212 can experience overload when 2*Δ*Ir+Ivis>ADC FULL-SCALE. Advantageously, because the mismatch correction circuit 420 calculates the mismatch error in the frequency domain, it is not affected by such ADC overload.

Depending on the specific implementation, the digital adjustment signal ($ADJ_{digital}$) output by the digital filter 424 can be used to adjust the gain of the current mirror 402, or the $ADJ_{digital}$ signal can first be converted to an analog adjustment signal ($ADJ_{analog}$) by an optional digital-to-analog converter (DAC) 426 and the $ADJ_{analog}$ can be used to adjust the gain of the current mirror 402. At a high level, the ADJ signal, whether a digital or an analog signal, is used to reduce and preferably substantially eliminate that mismatch error Δ by adjusting the gain of the current mirror 402. In certain embodiments, the ADJ signal can be used to essentially adjust the size of one or both of the transistors M1 and M2 of the current mirror 402. This can be accomplished by selectively connecting and/or disconnecting (i.e., switching in and/or out) one or more transistors within the current mirror circuit, as will be described in more detail below with reference to FIG. 7. In other embodiments, the ADJ signal can be used to adjust one or more voltages within the current mirror that affect the gain of the current mirror. Other variations are also possible while still being within the scope of the present invention.

For simplicity, the current mirror 402 is shown as a simple current mirror including transistors M1 and M2 each having their sources connected to a high voltage rail, with the gates of the transistors M1 and M2 connected together. However, it is noted that at least one of the transistor M1 and M2 can be implemented as a plurality of transistors that can be selectively connected in parallel, as can be appreciated from FIG. 7 discussed below. Additionally, the current mirror 402 can be different and/or more complex than shown, as is well known in the art, while still being within the scope of the present invention. For example, the current mirror can include degeneration resistors between the sources of transistors M1 and M2 and the voltage rail. Alternatively, or additionally, the current mirror can be implemented as a Widlar current mirror. Other variations are also possible. Further, while in the figures the transistors within the current mirror 402 are shown as being PMOS transistors, they can alternatively be PNP bipolar junction (BJT) transistors. Alternatively, the transistors within the current mirrors can be NMOS or NPN transistors, in which case the current mirror would be connected to a low voltage rail, e.g., ground (rather then the high voltage rail), and the photodetectors would be connected between a high voltage rail and the current mirror.

In FIGS. 3 and 4, the chopper circuit 304 is used to selectively diode connect (i.e., connect together the drain and the gate) of one of the transistors M1 and M2 at a time, with the other one of the transistors not being diode connected. The connected together drain and gate of the diode connected transistor (M1 or M2) are connected by the chopper circuit 304 to the anode of PD1, and the drain of the non-diode connected transistor (M2 or M1) is connected by the chopper circuit 304 to the anode of PD2. In the figures the chopper circuit 304 is shown as a simple chopper circuit including four switches, but can be different and/or more complex, as is well known in the art, while still being within the scope of the present invention.

In FIG. 4, and the other figures, the subtraction node (Nsub) was shown as being outside the dashed line boundary of the current mirror 402, but can instead be considered part of the current mirror 402. Whether or not the subtraction node (Nsub) is shown as being within the current mirror 402, the current mirror and the subtraction node can be collectively be considered an example of an analog circuit configured to replicate a first current to produced a replicated version of the first current, and to subtract the replicated version of the first current from a second current to produce a third current.

In accordance with the embodiments of the present invention described above, an analog subtraction of the currents I1 and I2 (produced respectively by PD1 and PD2) is performed. It would alternatively be possible to digitize the currents I1 and I2 (separately in parallel, or sequentially) and digitally perform the subtraction. However, for various reasons the analog subtraction is superior to the digital subtraction. For example, the analog subtraction is faster and requires less circuitry than the digital subtraction. Further, the analog subtraction is not subject to quantization noise that affects the digital subtraction, and the dynamic range of an ADC (e.g., 212) that digitizes the current (e.g., I3) resulting from the analog subtraction need not have as large as a dynamic range as would the one or more ADCs used to perform digital subtraction. However, a problem with performing an analog subtraction using a current mirror may occur due to the mismatch error Δ of the current mirror. Embodiments of the present invention described herein reduce and preferably substantially eliminate this mismatch error Δ.

Still referring to FIG. 4, the components of the mismatch correction circuit 420 can be considered parts of a feedback loop that reduces and preferably eliminates the mismatch error Δ associated with the current mirror 402. The ADC 212 can also be considered part of the feedback loop. This feedback loop adjusts the gain of the current mirror 402 so that the mismatch error at the chopping frequency is reduced, and preferably eliminated. To maximize the performance of the feedback loop, the digital filter 424 preferably has an infinite DC gain.

Figure 5A:
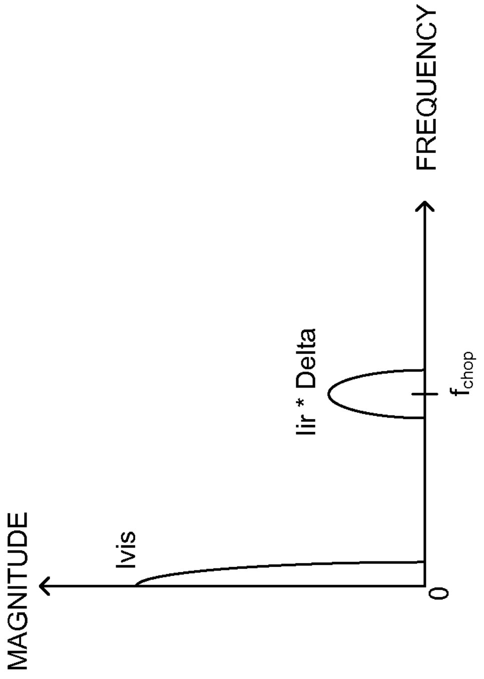
FIG. 5A is an exemplary graph illustrating the frequency content of the current I3 shown in FIG. 4 before the mismatch error of the current mirror is eliminated.
Figure 5B:
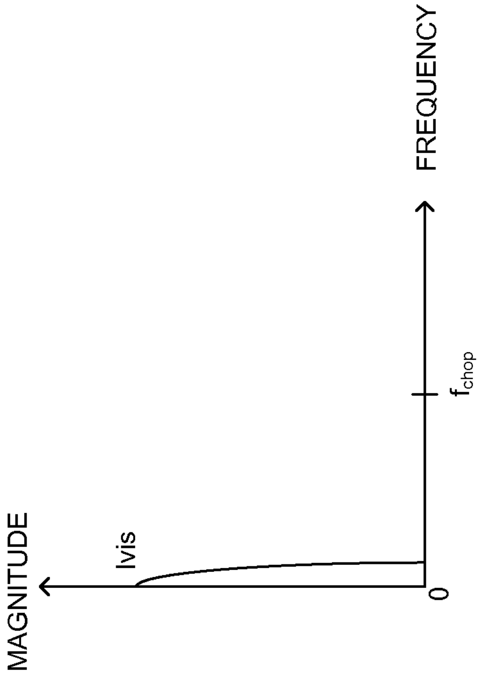
FIG. 5B is an exemplary graph illustrating the frequency content of the current I3 shown in FIG. 4 after the mismatch error of the current mirror is eliminated.

FIG. 5A is an exemplary graph illustrating the frequency content of the current I3 shown in FIG. 4 before the mismatch error of the current mirror is eliminated. FIG. 5B is an exemplary graph illustrating the frequency content of the current I3 shown in FIG. 4 after the mismatch error of the current mirror is eliminated by the mismatch correction circuit 420. Notice that in FIG. 5B the magnitude of the current at the chopping frequency is eliminated as compared to in FIG. 5A.

Figure 6A:
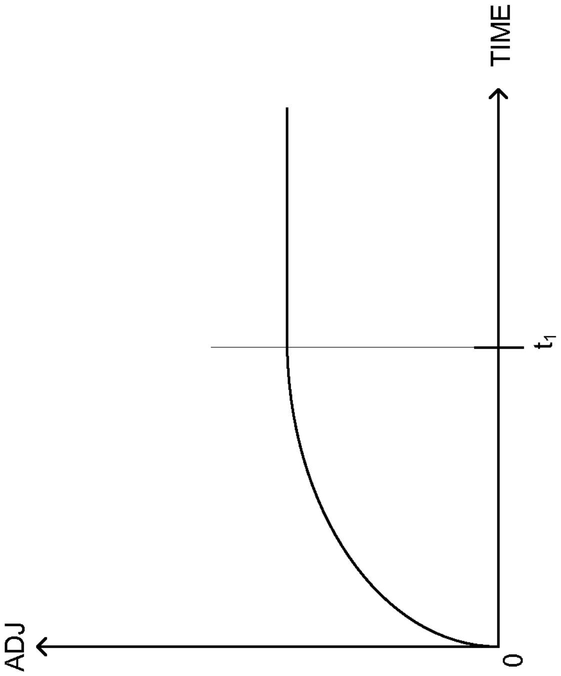
FIG. 6A is an exemplary graph that illustrates how the adjustment (ADJ) signal converges to a constant level once the mismatch error of the current mirror is eliminated.
Figure 6B:
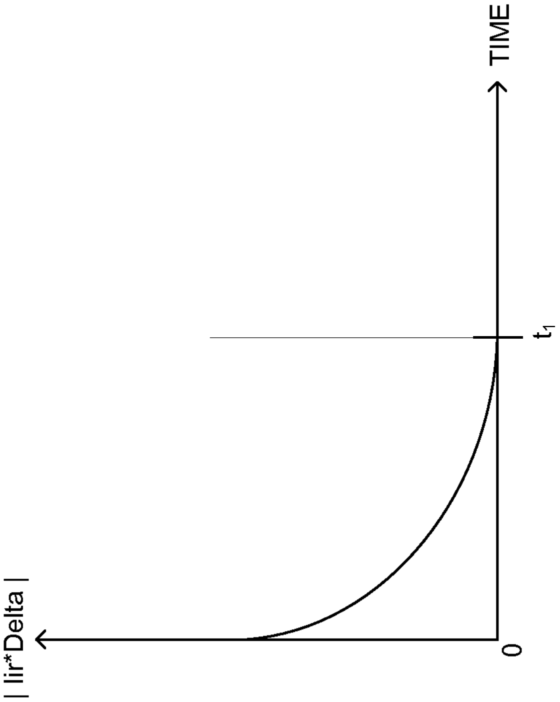
FIG. 6B is an exemplary graph that illustrates how a portion of a current resulting from the mismatch error converges to zero once the mismatch error of the current mirror is eliminated.

FIG. 6A is an exemplary graph that illustrates how the adjustment (ADJ) signal converges to a constant level once the mismatch error Δ of the current mirror is eliminated at time $t_1$. FIG. 6B is an exemplary graph that illustrates how $|Iir*\Delta|$ converges to zero at the same time $t_1$. In other words, FIGS. 6A and 6B illustrate that the mismatch error Δ approaches (and preferably equals) zero at time $t_1$.

Figure 7:
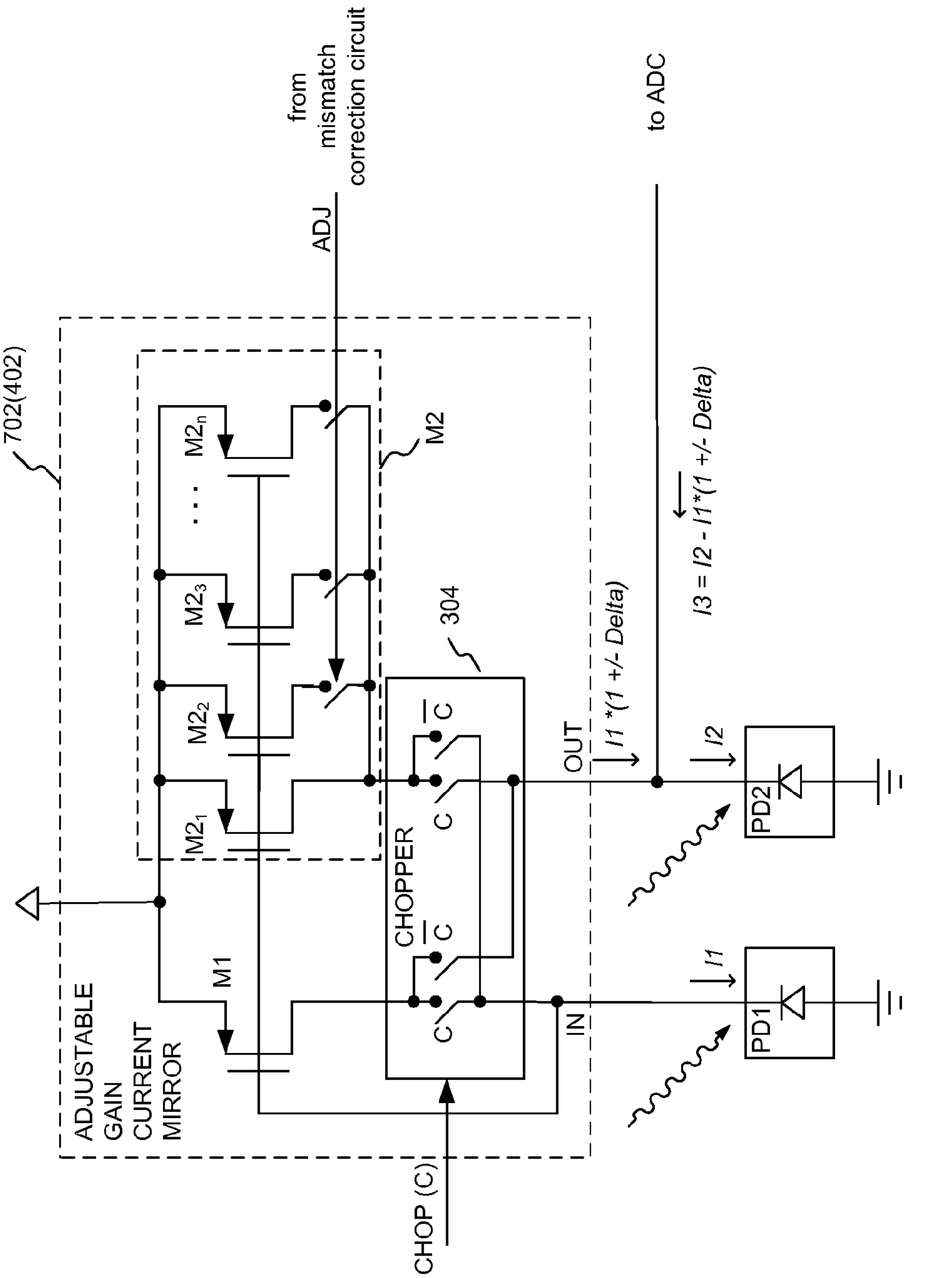
FIG. 7 illustrates an implementation of the adjustable gain current mirror introduced in FIG. 4, according to an embodiment of the present invention.

As mentioned above, the gain of the current mirror 402 can be adjusted by selectively connecting and/or disconnecting (i.e., switching in and/or out) one or more transistors within the current mirror circuit. An example of how this can be accomplished is illustrated in FIG. 7, which shows an adjustable gain current mirror 702, which is an exemplary implementation of the current mirror 402 discussed above. Referring to FIG. 7, the transistor M2 is shown as being implemented as a bank of parallel transistors $M2_1$ to $M2_n$, at least some of which can be selectively switched in and out of the circuit to essentially adjust the size of the transistor M2, to thereby adjust the gain of the current mirror 402. The transistors $M2_2$ to $M2_n$ can be equally weighted, binary weighted, or weighted in some other manner. The adjustment (ADJ) signal is used to selectively open and close switches that selectively connect and disconnect one or more of the transistors $M2_2$ to $M2_n$ in parallel with transistor $M2_1$. Alternatively, or additionally, the transistor M1 can similarly be implemented as a bank of parallel transistors. It would also be possible to have a bank of selectable transistors that each can be individually selectively connected in parallel with either M1 or M2 in dependence on the adjustment (ADJ) signal, to thereby adjust the gain of a current mirror. One of ordinary skill in the art reading this description will appreciate that other variations are possible and within the scope of the present invention.

Figure 8:
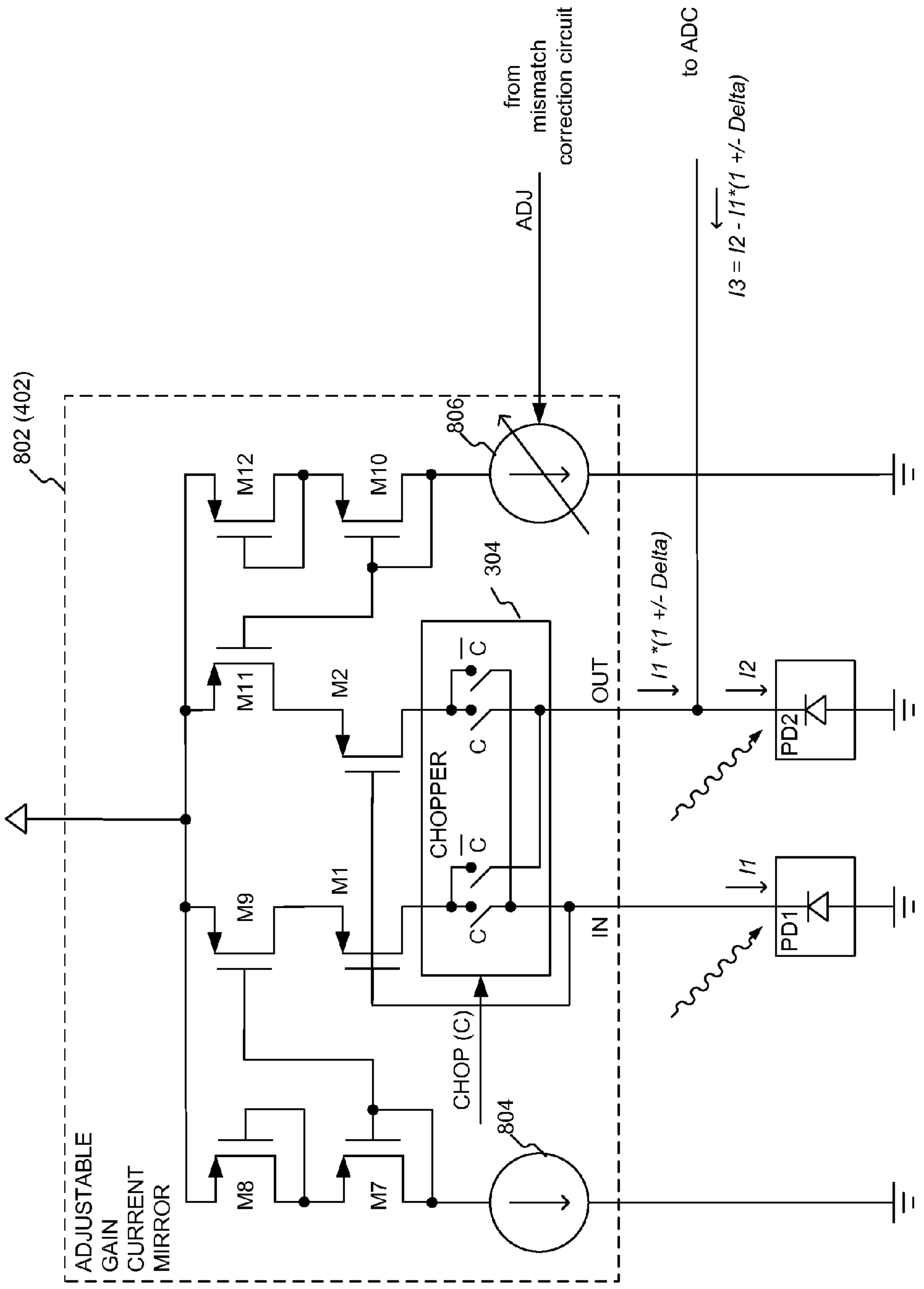
FIG. 8 illustrates an implementation of the adjustable gain current mirror introduced in FIG. 4, according to another embodiment of the present invention.

As also mentioned above, the adjustment (ADJ) signal can be used to adjust one or more voltages within the current mirror that affect the gain of the current mirror. An example of how this can be accomplished is illustrated in FIG. 8, which shows an adjustable gain current mirror 802, which is another exemplary implementation of the current mirror 402 discussed above. Referring to FIG. 8, transistors M9 and M11 operate in triode mode (also known as ohmic mode), and thus, function as adjustable resistors. Accordingly, the transistors M9 and/or M11 can be used adjust the voltages at the sources of transistors M1 and M2 of the current mirror 802 in order to adjust the gain of the current mirror 802. A current source 804 and transistors M7 and M8 set the voltage at the gate of the transistor M9, and thereby set the resistance of the transistor M9, which sets the voltage at the source of the transistor M1. A current source 806 and transistors M10 and M12 set the voltage at the gate of the transistor M11, and thereby set the resistance of the transistor M11, which sets the voltage at the source of the transistor M2. The current source 806 is shown as being adjusted by the adjustment (ADJ) signal, to thereby adjust the gain of the current mirror 802. Alternatively, or additionally, the current source 804 can be adjusted by the adjustment (ADJ) signal. Other variations are also possible while being within the scope of the present invention.

Referring briefly back to FIG. 4, in accordance with an embodiment, the adjustable gain current mirror 402 (with or without the ADC 212) can implemented as an integrated circuit (IC), also referred to as a chip. Such a chip can include pins or other connectors for connections to the photodetectors of PD1 and PD2, if PD1 and PD2 are off chip. Alternatively, it is also possible for the photodetectors of PD1 and PD2 to be incorporated into the same chip as the adjustable gain current mirror 402.

In accordance with an embodiment, the mismatch correction circuit 420 is outside the chip that includes the adjustable gain current mirror 402 and is used during foundry or post-foundry testing of the chip to calibrate the adjustable gain current mirror 402. In such an embodiment, fuses or the like can be permanently set once the gain of the current mirror 402 is set to substantially elimination the mismatch error Δ.

Alternatively, the mismatch correction circuit 420 can be implemented in the same chip or chip-set as the adjustable gain current mirror 402, and the mismatch correction circuit 420 can be continually used, or selectively used, in order to update the adjustment (ADJ) signal from time to time to compensate for circuit variations due to changes in temperature and/or aging of the transistors and/or other components within the current mirror 402. For example, assuming that the current mirror 402 and mismatch correction circuit 420 are part of a sub-system that is used in a larger system, the mismatch correction circuit 420 can be used to adjust the gain of the current mirror prior to operation of the system (e.g., during power-up of the system or sub-system), periodically, or on-demand. Where the mismatch correction circuit 420 is used periodically or on-demand, it can interrupt certain other functions of the system, it can be run in the background, or it can be used when the system is in a sleep or standby mode, but is not limited thereto.

Figure 9:
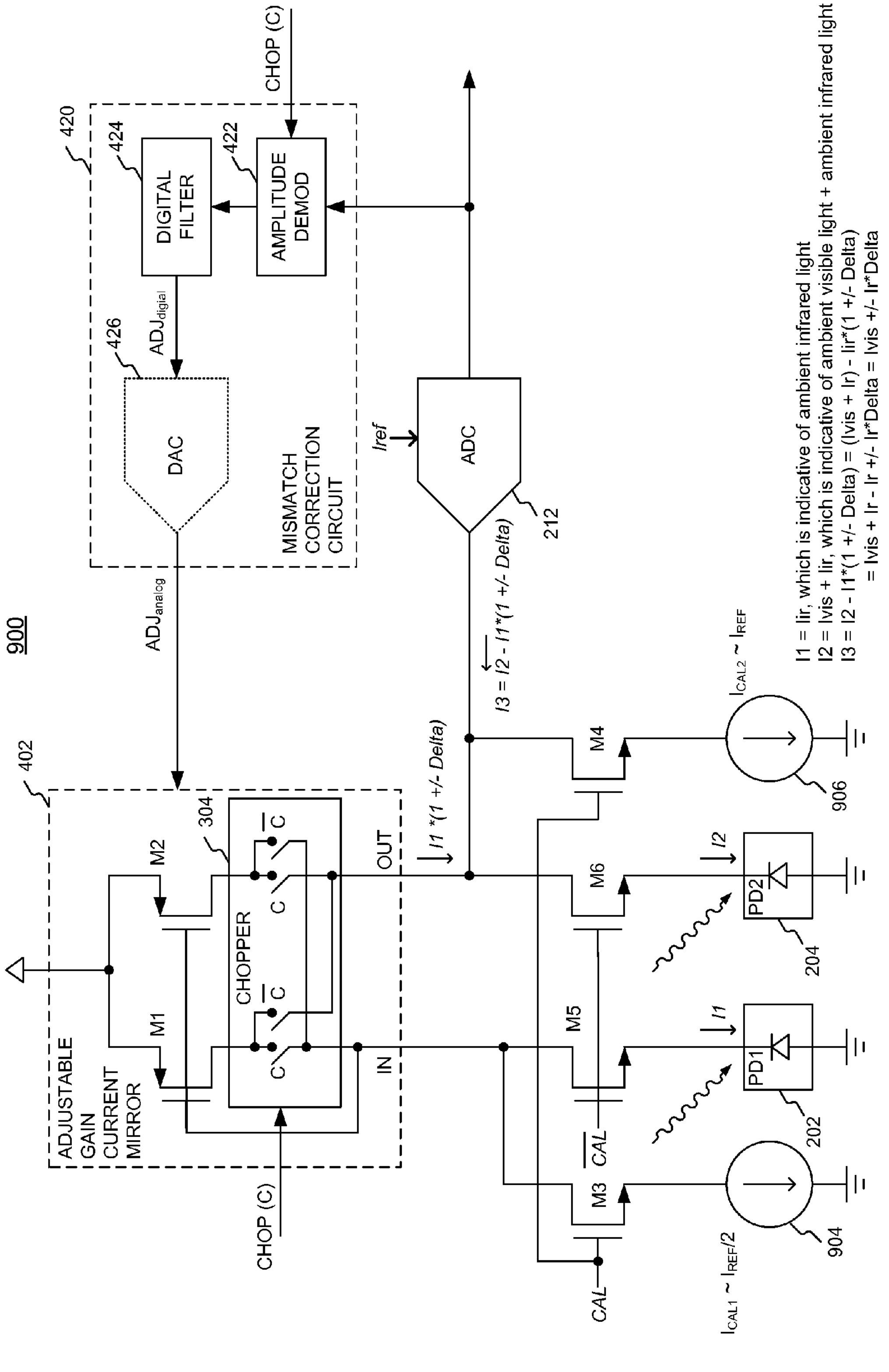
FIG. 9 illustrates a system for selective calibration of a current mirror, according to an embodiment of the present invention.

FIG. 9 illustrates an example system 900 for selective (e.g., power-up) calibration of the current mirror 402, according to an embodiment of the present invention. Referring to FIG. 9, when a calibration (CAL) signal is low, and a calibration-bar ( ) signal is high, transistors M3 and M4 are turned off, transistors M5 and M6 are turned on, and the circuit of FIG. 9 operates in the same manner as the circuit of FIG. 4. However, when the calibration (CAL) signal is set high, and the calibration-bar ( ) signal is low, the transistors M3 and M4 are turned on and the transistors M5 and M6 are turned off, which causes PD1 and PD2 to be disconnected from the rest of the circuit and current sources 904 and 906 (which produce, respectively ICAL1 and ICAL2) to be connected in their place. Beneficially, when the current sources 904 and 906 are used in place of PD1 and PD2 the calibration of the current mirror 402 can occur even if no light is incident on PD1 and PD2.

The system 900 can be operated as follows:

1. Set the frequency of the CHOP signal (i.e., $f_{CHOP}$) to half the sample rate ($f_s$) of the ADC 212 or slower;
2. Set CAL to high;
3. Enable the calibration currents $I_{CAL1}$ and $I_{CAL2}$;
4. Set CHOP=1 and measure the data sample at output of the ADC 212;
5. Set CHOP=−1 and measure the data sample at the output of the ADC 212;
6. Set the adjustment (ADJ) signal to reduce a different between the measured data sample at the ADC output when CHOP=1 and when CHOP=−1;
7. Repeat steps 4-6 until the data samples with CHOP=1 and CHOP=−1 are the same;
8. Set CAL to low; and
9. Set the frequency of the CHOP signal (i.e., $f_{CHOP}$) back to normal, which is likely higher than the sample rate ($f_s$) of the ADC 212.

In this embodiment, the CHOP signal is initially held high and the ADC conversion is completed, and the data sample at the output of the ADC 212 is stored, e.g., in a register. In the next step, the CHOP signal is held low and a second ADC conversion is completed and the data sample at the output of the ADC 212 is stored. The stored results of both of the conversions are compared, e.g., by a digital subtraction circuit. When the data output of the ADC 212 is independent of (i.e., the same regardless of) the state of the CHOP signal, the mismatch error Δ is eliminated.

Figure 10:
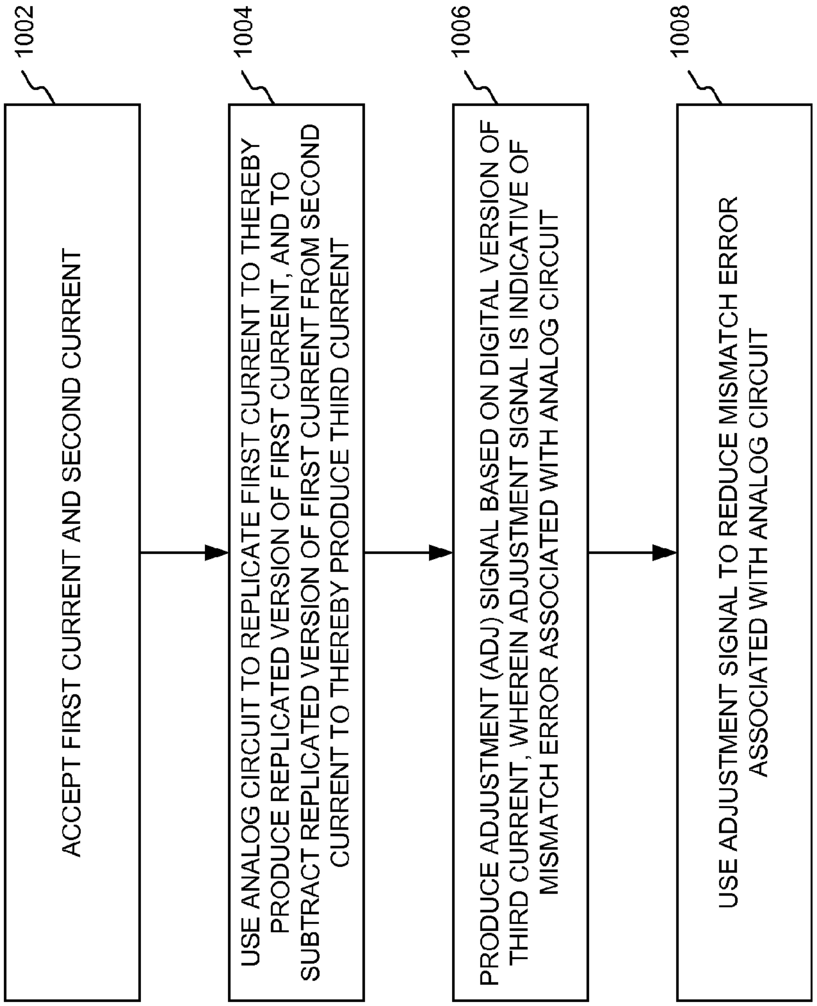
FIG. 10 is a high level flow diagram that is used to summarize methods in accordance with embodiments of the present invention.

FIG. 10 is a high level flow diagram that is used to summarize methods in accordance with embodiments of the present invention. Referring to FIG. 10, at step 1002, a first current I1 and a second current I2 are accepted, e.g., by the current mirror 402 in FIG. 4. At step 1004, an analog circuit is used to replicate the first current I1 to thereby produce a replicated version of the first current (I1+/−Δ), and to subtract the replicated version of the first current from the second current I2 to thereby produce a third current I3. At step 1006, an adjustment (ADJ) signal is produced based on a digital version of the third current I3, wherein the adjustment signal is indicative of the mismatch error Δ associated with the analog circuit. At step 1008, the adjustment (ADJ) signal is used to reduce the mismatch error associated with the analog circuit. As was described above, the analog circuit can includes a current mirror, and the adjustment signal can be used at step 1008 to adjust a gain of the current mirror to thereby reduce the mismatch error Δ associated with the analog circuit. As was described above, in accordance with embodiments of the present invention step 1006 is performed using a digital circuit, and more specifically, the mismatch correction circuit 420 in FIG. 4. More specifically, step 1006 can include amplitude demodulating the digital version of the third current to thereby produce a digital demodulated signal, and digitally filtering the digital demodulated signal to thereby produce the adjustment signal. In accordance with specific embodiments, the first current I1 is indicative of ambient infrared light, the second current I2 is indicative of ambient visible light and the ambient infrared light, and the third current is indicative of the ambient visible light and a portion of the ambient infrared light that is proportional to the mismatch error. Once the mismatch error is eliminated using the adjustment signal, the third current is indicative of the ambient visible light.

Figure 11:
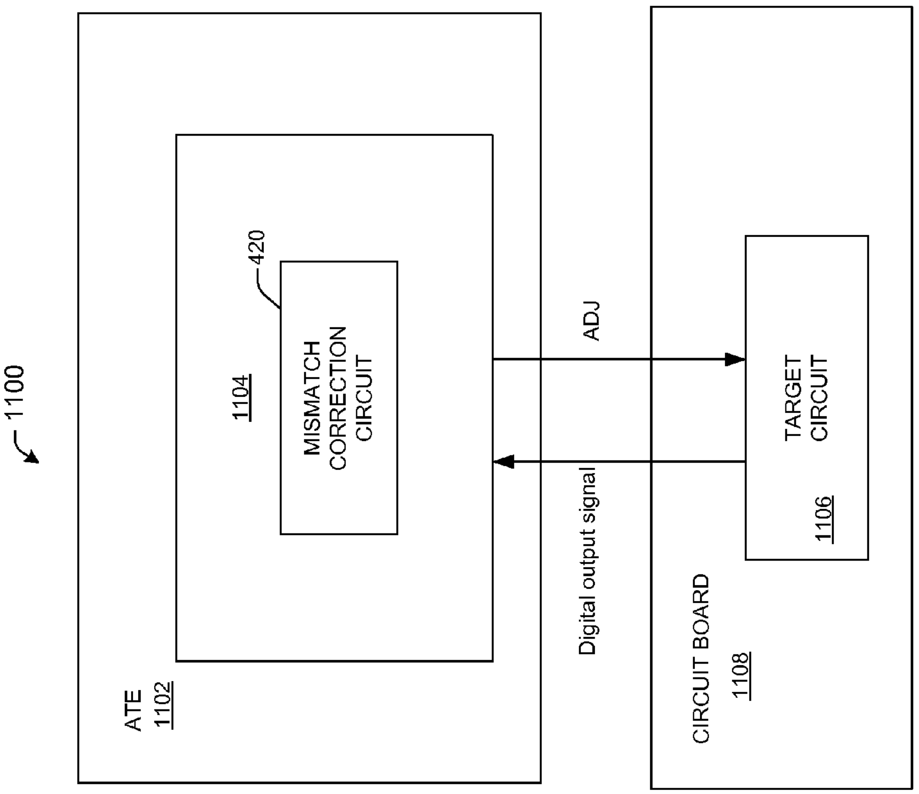
FIG. 11 illustrates an example system in which the embodiments of the present invention can be implemented.

FIG. 11 illustrates an example system in which the embodiments of the present invention can be implemented. The system 1100 includes Automatic Test Equipment (ATE) 1102 that includes a circuit 1104 (e.g., an integrated circuit), which includes the mismatch correction circuit 420, according to an embodiment of the present invention. A target circuit 1106 (e.g., another integrated circuit) is situated on a circuit board 1108 and is coupled to circuit 1104. In one aspect, the target circuit 1106 includes the current mirror circuit 402, the ADC 212 and/or the DAC 426. Specifically, the target circuit 1106 is tested by the ATE 1102. The mismatch correction circuit 420 can detect the mismatch error based on the digital output signal and generate an adjustment (ADJ) signal, which can be employed to calibrate the gain of the current mirror circuit 402 in the target circuit 1106 and remove the mismatch error from the output signal. Implementing the mismatch correction circuit 420 on the ATE 1102 can reduce hardware on the target circuit 1106 and accordingly decrease complexity and costs.

Figure 12:
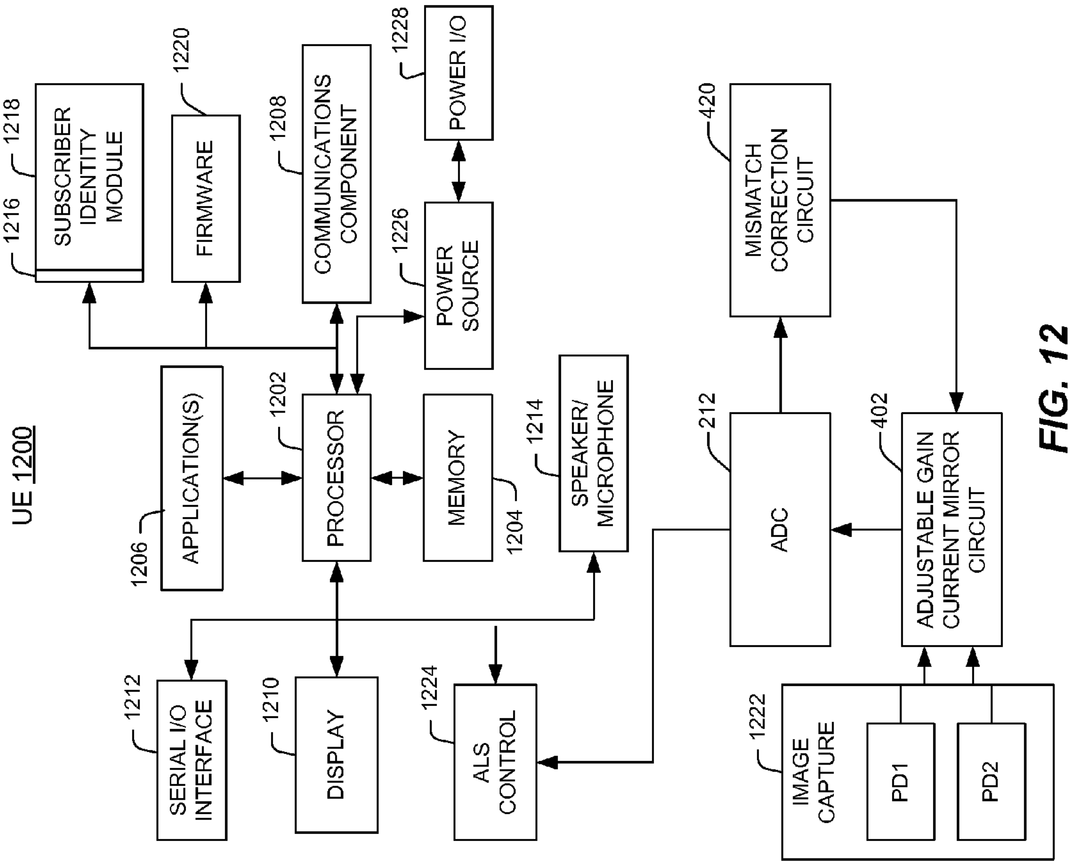
FIG. 12 illustrates how embodiments of the present invention can be employed to provide for accurate ambient light sensing with various types of user equipment.

Referring now to FIG. 12, there is illustrated a block diagram of user equipment (UE) 1200, according to an embodiment of the present invention, which includes the mismatch correction circuit 420. The UE 1200 can be most any consumer electronic device employed by a user, such as, but not limited to, a mobile phone, a personal digital assistant (PDA), a laptop, a personal computer, a media player, a gaming console, a media recorder, a tablet, a television, and the like. The UE 1200 can include a processor 1202 for controlling all onboard operations and processes. A memory 1204 can interface to the processor 1202 for storage of data and one or more applications 1206 being executed by the processor 1202. A communications component 1208 can interface to the processor 1202 to facilitate wired/wireless communication with external systems. The UE 1200 can also include a power source 1226 in the form of batteries, which power source 1226 interfaces to an external power system or charging equipment via a power I/O component 1228. Further, a I/O interface 1212 is provided in communication with the processor 1202, e.g., to facilitate serial communication (e.g., USB, and/or IEEE 13124) via a hardwire connection.

Furthermore, audio capabilities are provided with a speaker/microphone component 1214. In addition, the UE 1200 can include a slot interface 1216 for accommodating a subscriber identity module (SIM) 1218. Firmware 1220 is also provided to store and provide to the processor 1202 startup and/or operational data. In one aspect, the UE 1200 can include a display 1210 for displaying content downloaded and/or for displaying text information related to operating and using the device features. In one example, the display 1210 can be a touch screen. The UE 1200 can also include an image capture component 1222 such as a camera and/or a video decoder for decoding encoded multimedia content. In one example, the image capture component 1222 can include PD1 and PD2 that generate I1 and I2, where I1 is indicative if ambient infrared light, and I2 is indicative of ambient visible light and the ambient infrared light.

In addition, the UE 1200 can include a gain adjustable current mirror circuit 402, an ADC 212, and a mismatch correction circuit 420, which can include respective functionality, as more fully described above. According to an embodiment, an ALS control component 1224 can receive a signal indicative of the ambient visible light incident at the UE 1200, and control various components in the UE 1200 based on the signal. For example, the ALS control component 1224 can adjust settings (e.g., brightness control, contrast, etc.) of the display 1212 or backlight, switch off the power source 1226, modify parameters for image capture component 1222 (e.g., focal length, aperture setting, f-stops, exposure time, etc.).

Referring again to FIG. 4, and other figures described above, PD1 can be configured to produce a current I1 that is primarily indicative of ambient infrared light that is incident on PD1 and PD2, and PD2 can be configured to produce a current I2 that is primarily indicative of the ambient infrared light as well as the ambient visible light that is incident in PD1 and PD2. In order to achieve this, PD1 and PD2 can be covered by appropriate colored filters, e.g., red and green filters, respectively. A red filter is a type of infrared absorption filter, whereas a green filter provides a first approximation to a standard human eye spectral response, since green is dominant in human vision. However, filters of additional and/or other colors may be used. It is also possible that filter layers are stacked one above the other. For example, the photodetector(s) that make up PD2 can be covered by a green filter, while the photodetector(s) that make up PD1 can be covered by a green filter and a red filter stacked one above the other. For another example, as described in U.S. Pat. No. 7,960,807, entitled "Ambient Light Detectors Using Conventional CMOS Image Sensor Process", which is incorporated herein by reference, the photodetector(s) that make up PD1 can be covered by a green filter, a first sub-set of the photodetectors the make up PD2 can be covered by both a green and a red filter, and a second sub-set of the photodetectors the make up PD2 can be covered by both a green and a black filter. Further, alternative and/or other types of filters can be used, such as reflective filters, e.g., a dielectric reflective optical coating filter.

The various filters describe herein can be placed over off-the-shelf photodetectors, or can be manufactured on a same wafer as the photodetectors. For a further example, the photodetectors described in U.S. Pat. No. 7,755,117, entitled "Light Sensors with Infrared Suppression", can be used to produce a current primarily indicative of infrared light, e.g., by covering an active photodetector region with one or more layers intrinsic to CMOS technology, such as a silicide and/or or a Poly-Silicon layer. As described in the '117 patent, it is also possible to include oxide layers and/or wells within the photodetector, during manufacture of the photodetector, wherein such layers and/or wells are designed to selectively absorb or pass infrared or visible light. Other variations are also possible, and within the scope of the present invention.

Certain embodiments of the present invention are also directed to methods of producing currents that are primarily indicative of target wavelengths of light, e.g., wavelengths of visible light. In other words, embodiments of the present invention are also directed to methods for providing a sensor sub-system having a target spectral response, such as, a response similar to that of the human eye. Additionally, embodiments of the present invention are also directed to methods of using the above described sensor-subsystem.

In the embodiments described above, the target response was often described as being similar to that of a typical human eye viewing diffused light. However, that need not be the case. For example, other target responses can be for a produced current (e.g., I3) to be indicative of light of a specific color, such as red, green or blue. Such sensor sub-systems can be used, e.g., in digital cameras, color scanners, color photocopiers, and the like. Multiple instances of the above described embodiments may be used at the same time (e.g., in parallel), for example, in a spectrometer that includes various tightly defined spectral responses. Embodiments of the present invention can also be used to calibrate or otherwise control light emitting elements (e.g., laser diodes or light emitting diodes) that are used in optical storage sub-systems, proximity detection sub-systems, and the like.

In the embodiments described above, PD1 was often described as being configured to produce a current I1 that is indicative of ambient infrared light, and PD2 was often described as being configured to produce a current I2 that is indicative of the ambient infrared light as well as ambient visible light. By subtracting a replicated version of I1 from I2, the resulting current I3 is indicative of ambient visible light, and thus, the resulting sensor sub-system has a spectral response similar to a typical human eye. In such embodiments, the ambient visible light can be referred to as desired light, and the ambient infrared light can be referred to as undesired light. In such embodiments, and other embodiments in which their are alternative target spectral responses, the current I2 can be generically referred to as a current that is indicative of desired light as well as undesired light, and the current I1 can be generically referred to as a current that is indicative of the undesired light. By subtracting a replicated version of I1 from I2, the resulting current I3 is indicative of the desired light, and thus, the resulting sensor sub-system has a desired spectral response. Additionally, it is noted that embodiments of the present invention provide first order cancelation of the dark currents associated with PD1 and PD2.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A sub-system, comprising:

an analog circuit configured to replicate a first current to produce a replicated version of the first current, and to subtract the replicated version of the first current from a second current to produce a third current; and a mismatch correction circuit configured to produce an adjustment signal, indicative of a mismatch error associated with the analog circuit, based on a digital version of the third current;

wherein the adjustment signal is used to reduce the mismatch error associated with the analog circuit.

2. The sub-system of claim 1, wherein:

the analog circuit comprises a current mirror that is configured to replicate the first current to produce the replicated version of the first current; and the mismatch correction circuit comprises circuitry configured to adjust a gain of the current mirror to thereby reduce the mismatch error associated with the analog circuit.

3. The sub-system of claim 2, wherein the mismatch correction circuit is configured to selectively adjust the gain of the current mirror by selectively connecting and/or disconnecting one or more transistors within the current mirror circuit.

4. The sub-system of claim 2, wherein the mismatch correction circuit is configured to selectively adjust the gain of the current mirror by adjusting one or more voltages within the current mirror.

5. The sub-system of claim 2, wherein:

the current mirror includes a chopper circuit that is driven by a chopper signal; and the mismatch correction circuit includes a digital amplitude demodulator configured to demodulate the digital version of the third current, using the chopper signal or a reproduced or recovered version of the chopper signal, to thereby produce a digital demodulation output; and a digital filter configured to filter the digital demodulation output to thereby produce the adjustment signal.

6. The sub-system of claim 5, further comprising:

an analog-to-digital converter (ADC) configured to receive the third current and to output the digital version of the third current that is provided to the digital amplitude demodulator.

7. The sub-system of claim 5, wherein the digital amplitude demodulator comprises a multiplier configured to multiply the digital version of the third current by the chopping signal, or a recovered or reproduced version of the chopping signal, to thereby produce the digital demodulation output that is filtered by the digital filter to produce the adjustment signal.

8. The sub-system of claim 2, wherein:

the first current comprises a current produced by one of more photo detectors;

the second current comprises a current produced by one or more further photo detectors;

the first current is applied to the current mirror; and the current mirror produces the replicated version of the first current.

9. The sub-system of claim 8, wherein:

the subsystem comprises an ambient light sensor (ALS) sub-system;

the first current is indicative of ambient infrared light; and the second current is indicative of ambient visible light and the ambient infrared light;

the third current is indicative of the ambient visible light and a portion of the ambient infrared light that is proportional to the mismatch error.

10. The sub-system of claim 8, wherein:

the first current is indicative of undesired light;

the second current is indicative of desired light and the undesired light; and the third current is indicative of the desired light and a portion of the undesired light that is proportional to the mismatch error.

11. The sub-system of claim 1, wherein the sub-system is part of a system, and wherein the mismatch correction circuit is selectively employed in accordance with at least one of the following:

during power-up of the system or the sub-system;

prior to operation of the system;

during operation of the system;

in a background of the system;

during product testing of the system or the sub-system;

periodically; or on-demand.

12. A method for reducing a mismatch error associated within an analog circuit, comprising:

(a) accepting a first current and a second current;

(b) using the analog circuit to replicate the first current to thereby produce a replicated version of the first current, and to subtract the replicated version of the first current from the second current to thereby produce a third current;

(c) producing an adjustment signal based on a digital version of the third current, wherein the adjustment signal is indicative of the mismatch error associated with the analog circuit; and (d) using the adjustment signal to reduce the mismatch error associated with the analog circuit.

13. The method of claim 12, wherein the analog circuit includes a current mirror, and wherein step (d) includes using the adjustment signal to adjust a gain of the current mirror to thereby reduce the mismatch error associated with the analog circuit.

14. The method of claim 12, wherein step (c) is performed using a digital circuit.

15. The method of claim 12, wherein step (c) includes:

(c.1) amplitude demodulating the digital version of the third current to thereby produce a digital demodulated signal; and (c.2) digitally filtering the digital demodulated signal to thereby produce the adjustment signal.

16. The method of claim 12, wherein:

the first current is indicative of undesired light;

the second current is indicative of desired light and the undesired light; and the third current is indicative of the desired light and a portion of the undesired light that is proportional to the mismatch error.

17. The method of claim 16, further comprising:

(e) adjusting a parameter or function in dependence on the third current or the digital version of the third current.

18. A system, comprising:

a first sub-system including an analog circuit configured to replicate a first current to produce a replicated version of the first current, and to subtract the replicated version of the first current from a second current to produce a third current;

an analog-to-digital converter (ADC) configured to produce a digital version of the third current; and a mismatch correction circuit configured to produce an adjustment signal, indicative of a mismatch error associated with the analog circuit, based on the digital version of the third current;

wherein the adjustment signal is used to reduce the mismatch error associated with the analog circuit; and a second sub-system configured to be adjusted in dependence on the third current or the digital version of the third current.

19. The system of claim 18, wherein:

the first sub-system comprises an ambient light sensor (ALS) sub-system; and the second sub-system comprises a display that is configured to have its brightness adjusted in dependence on the third current or the digital version of the third current.

20. The system of claim 18, wherein the system, which includes the first and second sub-systems, comprises at least one of the following:

a mobile phone;
a personal data assistant;
a tablet computer;
a laptop computer;
a media player;
a media recorder;
a television; or
a gaming module.

* * * * *